（12） United States Patent
Schultz et al.

(10) Patent No.: US 10,263,067 B2
(45) Date of Patent: Apr. 16, 2019

(54) CHIP CAPACITOR CIRCUIT AND STRUCTURE THEREFOR

(71) Applicant: NXP USA, INC., Austin, TX (US)

(72) Inventors: Joseph Gerard Schultz, Hoffman Estates, IL (US); Yu-Ting Wu, Schaumburg, IL (US); Shishir Ramasare Shukla, Chandler, AZ (US); Enver Krvavac, Hoffman Estates, IL (US); Hussain Hasanali Ladhani, Chandler, AZ (US); Damon G. Holmes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/593,366

(22) Filed: May 12, 2017

(65) Prior Publication Data

US 2018/0331172 A1  Nov. 15, 2018

(51) Int. Cl.
*H01L 23/66* (2006.01)
*H01L 49/02* (2006.01)
*H01L 23/00* (2006.01)
*H01L 23/498* (2006.01)
*H03F 3/19* (2006.01)
*H03F 3/24* (2006.01)

(52) U.S. Cl.
CPC ........ *H01L 28/40* (2013.01); *H01L 23/49811* (2013.01); *H01L 23/66* (2013.01); *H01L 24/14* (2013.01); *H03F 3/19* (2013.01); *H03F 3/245* (2013.01); *H01L 2223/6655* (2013.01); *H03F 2200/451* (2013.01)

(58) Field of Classification Search
CPC ......... H01L 28/40; H01L 24/14; H01L 23/66; H01L 23/49; H01L 23/498; H01L 23/4981; H01L 23/49811

USPC ....................................................... 257/532
See application file for complete search history.

(56) References Cited

U.S. PATENT DOCUMENTS

| | | | |
|---|---|---|---|
| 4,663,694 A | 5/1987 | Sakamoto | |
| 6,177,716 B1 * | 1/2001 | Clark | H01L 27/0805 257/249 |
| 7,589,370 B2 | 9/2009 | Lamey et al. | |
| 8,716,778 B2 | 5/2014 | Chen et al. | |
| 9,142,607 B2 | 9/2015 | Cheng et al. | |
| 2007/0278619 A1 * | 12/2007 | Clevenger | H01L 21/76898 257/532 |

OTHER PUBLICATIONS

Aparicio, R.; Capacity Limits and Matching Properties of Integrated Capacitors, IEEE Journal of Solid-State Circuits, vol. 37, No. 3, Mar. 2002.
U.S. Appl. No. 15/373,953, filed Dec. 9, 2016, entitled "Parallel LC Resonator and Method Therefor".

* cited by examiner

*Primary Examiner* — Monica D Harrison

(57) ABSTRACT

A radio frequency (RF) chip capacitor circuit and structure are provided. The circuit and structure include a plurality of capacitors connected in series. Each capacitor of the plurality includes a first plate formed from a first metal layer and a second plate formed from a second metal layer. A first two adjacent capacitors of the plurality include first plates formed in a first contiguous portion of the first metal layer or second plates formed in a second contiguous portion of the second metal layer. Each capacitor of the plurality may include a dielectric layer disposed between the first plate and the second plate.

20 Claims, 3 Drawing Sheets

CHIP CAPACITOR CIRCUIT AND STRUCTURE THEREFOR

BACKGROUND

Field

This disclosure relates generally to radio frequency (RF) electronic components, and more specifically, to chip capacitors for use with electronic components.

Related Art

Today, radio frequency (RF) systems are used to provide wireless communication, for example, for cellular telephony, wireless data networks, and radio systems. Such RF systems may include circuitry that requires one or more chip capacitors. These chip capacitors may include a metal-insulator-metal (MIM) capacitor structure formed using a semiconductor fabrication process typically used to form semiconductor devices. As suggested by its name, a MIM capacitor may include a pair of metallic capacitor plates above and below an insulating material. RF circuitry employing one or more MIM chip capacitors may operate at high frequencies and high power. However, challenges remain in achieving improved accuracy, efficiency, and performance of RF circuitry operating at such high frequencies and high power.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a thin-film, metal-insulator-metal (MIM) chip capacitor structure including a plurality of mirrored series connected MIM capacitors arranged to span a distance between bonding terminals. The capacitors are symmetrically arranged and connected to one another in an alternating manner having top or bottom plates of adjacent capacitors sharing a portion of a metal layer. The symmetrical arrangement is formed without using interconnect structures such as vias and contacts. The bonding terminals are configured for flip-chip mounting to eliminate bond wires in a chip capacitor package.

Figure 1:
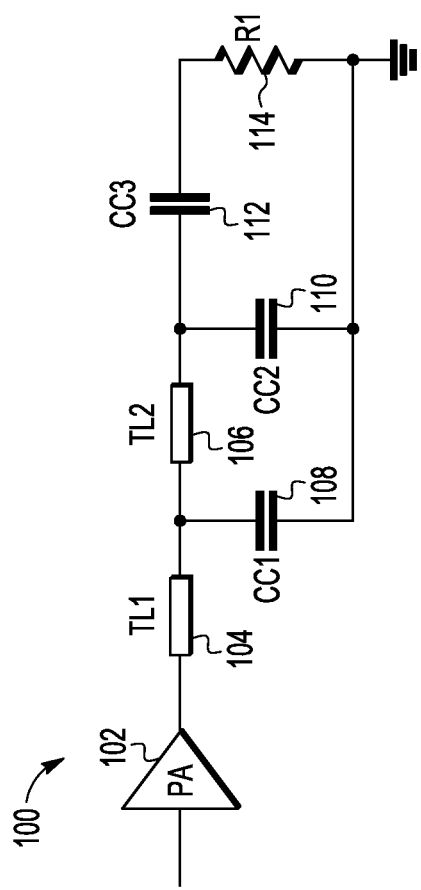
FIG. 1 illustrates, in schematic diagram form, an exemplary radio frequency (RF) power amplifier (PA) matching circuit employing chip capacitors in accordance with an embodiment of the present disclosure.

By arranging the capacitors in series, each capacitor can be physically larger thus minimizing parasitic effects common with a single small capacitor and associated interconnect between the small capacitor and bonding terminals. Forming the series symmetrically without vias or contacts allows further minimization of parasitic effects common with interconnection across metallization layers. And flip-chip mounting provides yet further minimization of resistive and inductive parasitic effects common with bonding wires. By minimizing and virtually eliminating many of these parasitic effects, accuracy, efficiency, and performance of radio frequency (RF) circuits can be enhanced FIG. 1 illustrates, in schematic diagram form, an exemplary radio frequency (RF) power amplifier (PA) matching circuit 100 employing chip capacitors (108-112) in accordance with an embodiment of the present disclosure. Matching circuit 100 includes power amplifier 102 labeled PA, first transmission line 104 and second transmission line 106 labeled TL1 and TL2, chip capacitors 108-112 labeled CC1-CC3 and termination resistor 114 labeled R1. Output of power amplifier 102 is coupled to a first terminal of capacitor 108 by way of first transmission line 104, and a second terminal of capacitor 108 is coupled to a ground power supply terminal. A first terminal of capacitor 110 is coupled to the first terminal of capacitor 108 by way of second transmission line 106, and a second terminal of capacitor 110 is coupled to the ground power supply terminal. Capacitor 112 and resistor 114 are coupled in series with first and second transmission lines 104 and 106. A first terminal of capacitor 112 is coupled to the first terminal of capacitor 110, a second terminal of capacitor 112 is coupled to a first terminal of resistor 114, and a second terminal of resistor 114 is coupled to the ground power supply terminal.

Figure 2:
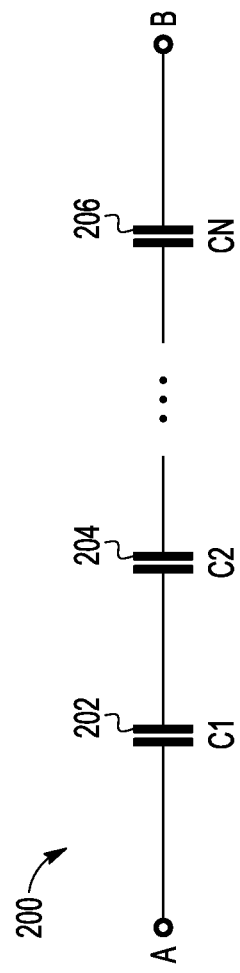
FIG. 2 illustrates, in schematic diagram form, exemplary series connected capacitor elements in accordance with an embodiment of the present disclosure.

FIG. 2 illustrates, in schematic diagram form, exemplary series connected capacitor elements 200 in accordance with an embodiment of the present disclosure. The series connected capacitor elements 200 includes a first terminal labeled A, a second terminal labeled B, and a series of capacitors 202-206 labeled C1-CN, where N is the number of series connected capacitors. The series of capacitors C1-CN includes first capacitor C1 having a first terminal coupled to the A terminal and a second terminal coupled to a first terminal of second capacitor C2. A second terminal of second capacitor C2 is coupled to a terminal of a next capacitor and so on until last capacitor CN having a first terminal coupled to a terminal of a previous capacitor and a second terminal coupled to the B terminal. In this embodiment, capacitors C1-CN are formed as thin film, metal-insulator-metal (MIM) capacitors. The number of series connected capacitors N is chosen in part based on a desired capacitance value. The number of series connected capacitors N is preferably an even number to achieve symmetrical arrangement. The series connected capacitor elements 200 may be formed into a chip capacitor such as chip capacitors 108-112 shown in FIG. 1, for example.

Figure 3:
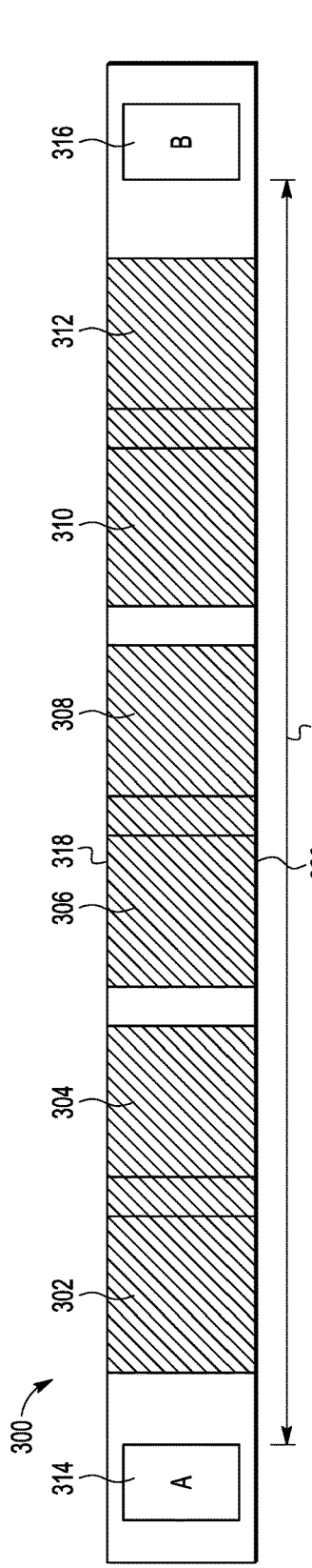
FIG. 3 illustrates, in a plan view, an exemplary device layout of series connected capacitor structure in accordance with an embodiment of the present disclosure.

FIG. 3 illustrates, in a plan view, an exemplary series connected capacitor structure 300 in accordance with an embodiment of the present disclosure. Capacitor structure 300 depicts an exemplary layout implementation of series connected capacitor elements like those of FIG. 2 (with N=6). The layout of capacitor structure 300 includes a plurality of symmetrically arranged series connected capacitors (302-312) formed on a common substrate. The plurality of capacitors includes six capacitors 302-312 connected in series, and arranged and distributed to substantially span the distance between a first bonding terminal 314 labeled A and a second bonding terminal 316 labeled B. The span distance 322 between bonding terminals 314 and 316 may be determined in part based on packaging constraints or printed circuit board constraints or combination thereof, for example.

A first terminal of capacitor 302 is connected at bonding terminal 314 by way of a first metal layer and a second terminal of capacitor 302 is connected to a first terminal of capacitor 304 by way of a second metal layer (hatch shaded areas). A second terminal of capacitor 304 is connected to a first terminal of capacitor 306 by way of first metal layer and a second terminal of capacitor 306 is connected to a first terminal of capacitor 308 by way of second metal layer. A second terminal of capacitor 308 is connected to a first terminal of capacitor 310 by way of first metal layer and a second terminal of capacitor 310 is connected to a first terminal of capacitor 312 by way of second metal layer. A second terminal of capacitor 312 is connected at bonding terminal 316 by way of first metal layer.

Because six substantially similar sized capacitors 302-312 are connected in series, an equivalent capacitance between the first terminal and the second terminal may be substantially one-sixth of the capacitance of the individual capacitors of the plurality. The equivalent capacitance value may be any desired value. For example, to achieve a desired equivalent capacitance value of 0.5 picofarads (pF), each of the six substantially similar sized capacitors 302-312 would be sized six times (6×) larger (than a single equivalent capacitor) having a capacitance value of 3.0 pF. Because each capacitor is 6× larger, parasitic effects can be minimized and tolerances improved yielding higher quality capacitors. For example, by symmetrically distributing larger capacitors along the span distance 322 rather than a single capacitor, parasitic inductance and resistance can be greatly reduced. Furthermore, by minimizing these parasitic effects and improving tolerances, more accurate matching circuit performance can be realized.

In this embodiment, capacitors 302-312 are formed as metal-insulator-metal (MIM) capacitors. Each capacitor (302-312) is formed from overlapping portions of the first metal layer, the second metal layer, and the dielectric layer. Capacitors 302-312 may be formed in any suitable shapes and sizes. In the embodiment illustrated in FIG. 3, the capacitors are formed in substantially equally sized square shapes. To form larger capacitors while maintaining a predetermined span distance 322, capacitor shapes coincident with sides 318 and 320 of the capacitor shapes can be stretched further apart from one another, forming rectangular shapes and increasing the overall area of each capacitor, for example. In some embodiments while maintaining a predetermined span distance 322, two or more of the series connected capacitor structures (300) may be abutted side-by-side at sides 318 and 322. In some embodiments, capacitors may be formed in a size different from other capacitors in the series (302-312). For example, it may be desirable to form a plurality of N number of series connected capacitors to be distributed along span distance 322 where first and second capacitors are connected at bonding terminals 314 and 316 respectively. In this example, first and second capacitors can be formed as a different size (e.g., larger) than the remaining N−2 capacitors coupled in series between the first and second capacitors.

Figure 4:
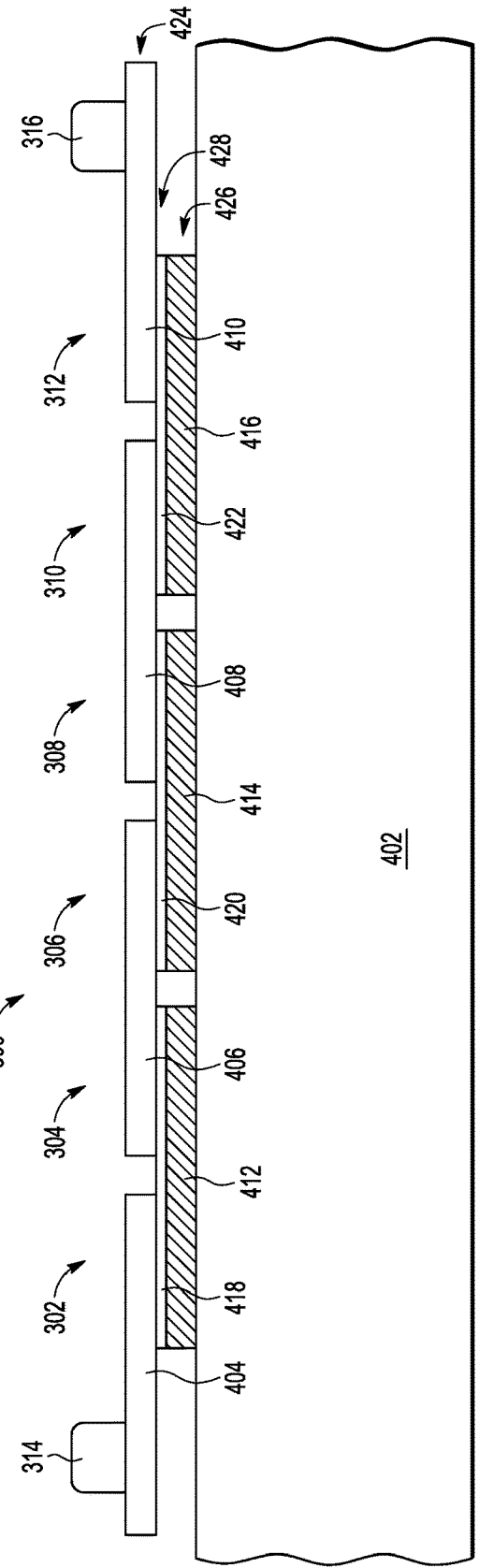
FIG. 4 illustrates, in a cross-sectional view, exemplary device layout of series connected capacitor structure in accordance with an embodiment of the present disclosure.

FIG. 4 illustrates, in cross-sectional view form, series connected capacitor structure 300 in accordance with an embodiment of the present disclosure. The cross-sectional view of the layout illustrated in FIG. 3 includes a more detailed representation of capacitor structure 300 forming plurality of series connected capacitors (302-312).

The plurality of series connected capacitors includes six capacitors 302-312 connected in series, and arranged and distributed to substantially span the distance between the first bonding terminal 314 and the second bonding terminal 316. In this embodiment, capacitors 302-312 are formed as metal-insulator-metal (MIM) capacitors. Each MIM capacitor 302-312 includes a top plate (404-410) formed from a first metal layer 424, and a bottom plate (412-416) formed from a second metal layer 426 (hatch shaded areas) over the substrate 402. A dielectric material (418-422) is disposed between the top and bottom plates of each MIM capacitor. MIM capacitors 302-312 may be formed from any two different metal layers separated by one or more dielectric layers 428. The metal layers 424 and 426 of MIM capacitors 302-312 may be formed from a variety of electrically conductive materials including, for example, copper, gold, silver, aluminum, nickel, tungsten, and alloys thereof. The one or more dielectric layers 428 may be formed from a wide range of materials used for interlayer dielectrics, for example, including silicon dioxide, silicon nitride, silicon oxy-nitride, or any combination of such layers providing electrical isolation.

The capacitors 302-312 are connected to one another in an alternating manner having top or bottom plates of adjacent capacitor pairs formed in a contiguous portion of first or second metal layers. A top plate of capacitor 302 is formed from a first portion 404 of the first metal layer 424 and a bottom plate formed from a first portion 412 of the second metal layer 426 separated by dielectric 418. The top plate of capacitor 302 is connected at bonding terminal 314 by way of first portion 404 of the first metal layer. A top plate of capacitor 304 is formed from a second portion 406 of the first metal layer and a bottom plate formed from the first portion 412 of the second metal layer separated by dielectric 418. The bottom plate of capacitor 302 is connected to the bottom plate of capacitor 304 by way of first portion 412 of the second metal layer. A top plate of capacitor 306 is formed from the second portion 406 of the first metal layer and a bottom plate formed from a second portion 414 of the second metal layer separated by dielectric 420. The top plate of capacitor 304 is connected to the top plate of capacitor 306 by way of the second portion 406 of the first metal layer. A top plate of capacitor 308 is formed from a third portion 408 of the first metal layer and a bottom plate formed from the second portion 414 of the second metal layer separated by dielectric 420. The bottom plate of capacitor 306 is connected to the bottom plate of capacitor 308 by way of second portion 414 of the second metal layer. A top plate of capacitor 310 is formed from the third portion 408 of the first metal layer and a bottom plate formed from a third portion 416 of the second metal layer separated by dielectric 422. The top plate of capacitor 308 is connected to the top plate of capacitor 310 by way of the third portion 408 of the first metal layer. A top plate of capacitor 312 is formed from a fourth portion 410 of the first metal layer and a bottom plate formed from the third portion 416 of the second metal layer separated by dielectric 422. The bottom plate of capacitor 310 is connected to the bottom plate of capacitor 312 by way of third portion 416 of the second metal layer. The top plate of capacitor 312 is connected at bonding terminal 316 by way of the fourth portion 410 of the first metal layer.

As illustrated in FIG. 4, bottom plates of adjacent capacitors 302 and 304 are formed in the same contiguous first portion 412 of the second metal layer, top plates of adjacent capacitors 304 and 306 are formed in the same contiguous second portion 406 of the first metal layer, bottom plates of adjacent capacitors 306 and 308 are formed in the same contiguous second portion 414 of the second metal layer, top plates of adjacent capacitors 308 and 310 are formed in the same contiguous third portion 408 of the first metal layer, and bottom plates of adjacent capacitors 310 and 312 are formed in the same contiguous third portion 416 of the second metal layer. Each of portions 404-410 of the first metal layer are separate from one another, and each of portions 412-416 of the second metal layer are separate from one another.

Bonding terminals 314 and 316 may be any suitable conductive structures to allow flip-chip or face-down mounting of capacitor structure 300 onto a substrate, semiconductor die, lead frame, printed circuit board, and the like. For example, bonding terminals 314 and 316 may be in form of solder balls, copper pillars, gold studs, and the like.

Because six substantially similar sized capacitors 302-312 are connected in series, an equivalent capacitance between the first bonding terminal 314 and the second bonding terminal 316 may be substantially one-sixth of the capacitance of the individual capacitors of the plurality. For example, to achieve a desired equivalent capacitance value of 0.5 picofarads (pF), each of the six substantially similar sized capacitors 302-312 would be sized six times (6×) larger (than a single equivalent capacitor) having a capacitance value of 3.0 pF. Because each capacitor is 6× larger, parasitic effects can be minimized and tolerances improved yielding higher quality capacitors. For example, by symmetrically distributing larger capacitors along the span distance rather than a single capacitor, parasitic inductance, capacitance, and resistance can be greatly reduced. Furthermore, the capacitor structure 300 as illustrated in FIGS. 3 and 4 allow for the series connection of capacitors 302-312 to be formed without using via or contact interconnect structures, and thus, eliminate parasitic effects associated with such structures. By minimizing the above-mentioned parasitic effects, more accurate matching circuit performance can be realized.

Figure 5:
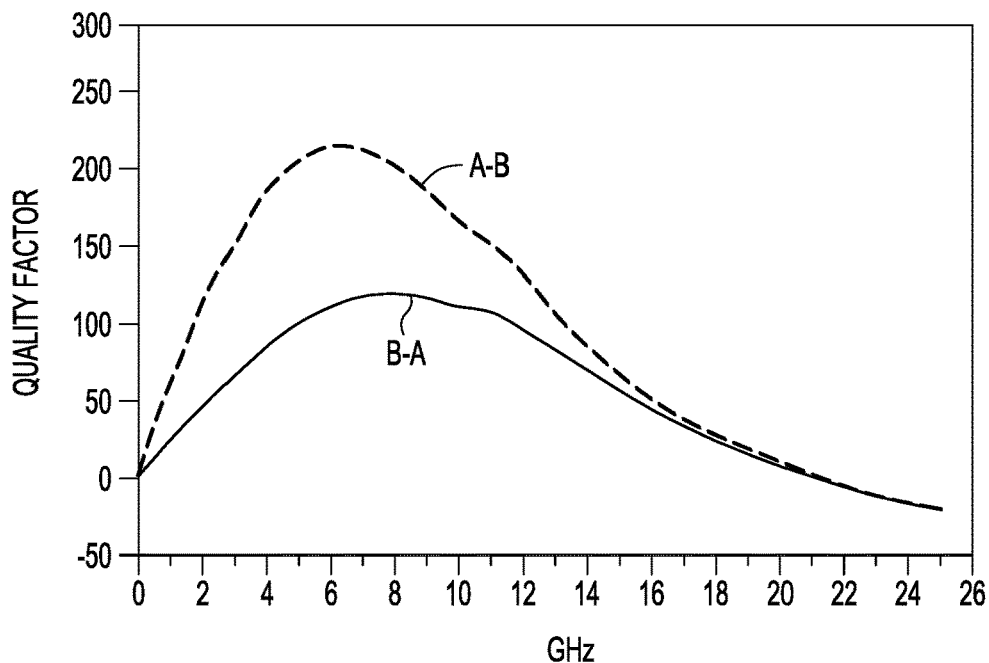
FIG. 5 illustrates, in a graphical view, simulation results of an exemplary polarized chip capacitor in accordance with an embodiment of the present disclosure.

FIG. 5 illustrates, in a graphical view, simulation results of an exemplary polarized chip capacitor in accordance with an embodiment of the present disclosure. Shown are quality factor simulation results of polarized chip capacitor versus frequency. Frequency values are shown in gigahertz (GHz) on the X-axis, and quality factors are shown on the Y-axis. FIG. 5 includes two waveforms depicting simulation results with a polarized chip capacitor configured in a first orientation (A-B), and in a second orientation (B-A) reverse of the first orientation.

The polarized chip capacitor, as used herein, may include an asymmetrical capacitor arrangement. For example, the asymmetrical capacitor arrangement may include a single capacitor having a first plate formed from a first metal layer and a second plate formed from a second metal layer. The first plate of the capacitor may be connected to a first (A) terminal, and the second plate of the capacitor may be connected to a second (B) terminal. Vias and/or contacts may be used to form connections between capacitor plates and terminals in the asymmetrical capacitor arrangement.

The waveform labeled A-B illustrates simulated results of the polarized chip capacitor configured in the first orientation where the A terminal is coupled to a higher potential node and the B terminal is coupled to a lower potential node. Such a polarized capacitor may include a plus (+) sign indication corresponding to the A terminal of the chip capacitor package, for example. The waveform labeled B-A illustrates simulated results of the polarized chip capacitor configured in the second orientation where the B terminal is coupled to a higher potential node and the A terminal is coupled to a lower potential node. Waveform A-B shows a significantly higher quality factor versus waveform B-A across most of the simulated frequency range. Thus, it may be preferable to configure a polarized chip capacitor in the first orientation (A-B). However, it may be preferable to configure the polarized chip capacitor in the second orientation (B-A) for reliability or other electrical characteristics, for example.

Figure 6:
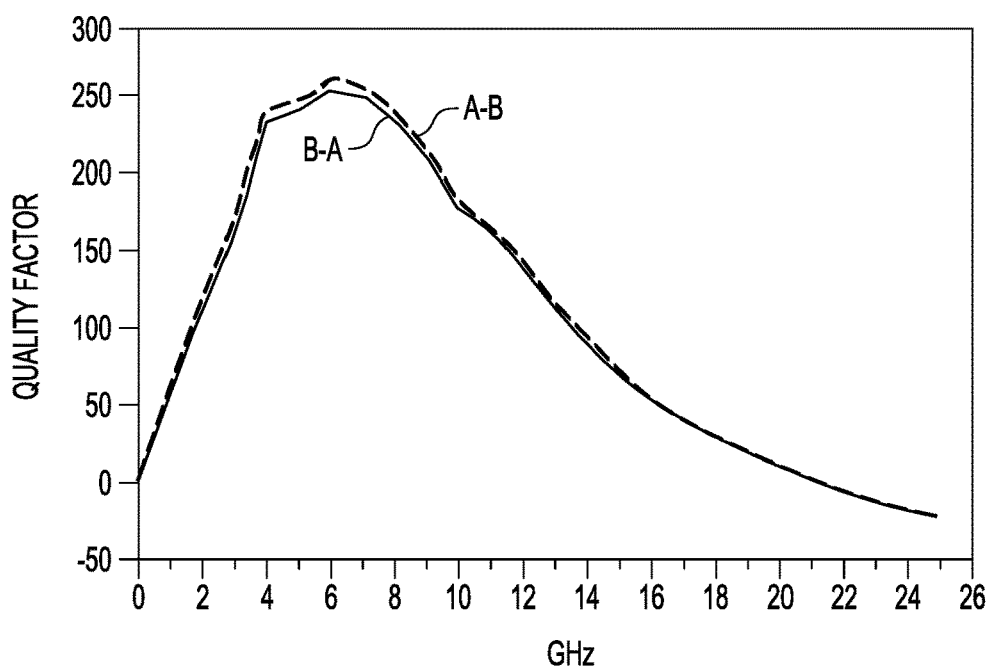
FIG. 6 illustrates, in a graphical view, simulation results of exemplary series connected capacitor structure in accordance with an embodiment of the present disclosure.

FIG. 6 illustrates, in a graphical view, simulation results of exemplary series connected capacitor structure in accordance with an embodiment of the present disclosure. Shown are quality factor simulation results of a chip capacitor employing capacitor structure 300 versus frequency. Frequency values are shown in gigahertz (GHz) on the X-axis, and quality factors are shown on the Y-axis. FIG. 6 includes two waveforms depicting simulation results with the chip capacitor employing capacitor structure 300 configured in a first orientation (A-B), and in a second orientation (B-A) reverse of the first orientation. The waveform labeled A-B illustrates simulated results of the chip capacitor configured in the first orientation where the A terminal is coupled to a higher potential node and the B terminal is coupled to a lower potential node. The waveform labeled B-A illustrates simulated results of the chip capacitor configured in the second orientation where the B terminal is coupled to a higher potential node and the A terminal is coupled to a lower potential node.

As illustrated in FIG. 6, waveform A-B shows nearly identical quality factor results versus waveform B-A across the entire simulated frequency range. Because simulation results are nearly identical and independent of orientation, the chip capacitor employing capacitor structure 300 may be characterized as a non-polarized chip capacitor, allowing for optimum signal performance and reliability regardless of orientation. For example, the chip capacitor employing capacitor structure 300 may be placed on a printed circuit board without requiring a particular orientation and still achieve optimum signal performance. In addition, lower costs may be realized as pick and place equipment may provide higher reliability and better quality without losses due to orientation errors.

Still referring to FIG. 6, peak quality factor of both waveforms (A-B, B-A) is approximately 250 at 7 GHz versus peak quality factor of approximately 200 at 7 GHz shown for the polarized chip capacitor waveform (A-B) in FIG. 5. Thus, it may be desirable to utilize the chip capacitor employing capacitor structure 300 over the polarized chip capacitor of FIG. 5.

Generally, there is provided, a radio frequency (RF) circuit including a plurality of capacitors connected in series, each capacitor of the plurality including: a first plate formed from a first metal layer; and a second plate formed from a second metal layer; wherein a first two adjacent capacitors of the plurality include first plates formed in a first contiguous portion of the first metal layer or second plates formed in a second contiguous portion of the second metal layer. The plurality may include an even number of capacitors connected in series. Each capacitor of the plurality may include a dielectric layer disposed between the first plate and the second plate. Each capacitor of the plurality may be formed from overlapping portions of the first metal layer, the second metal layer, and the dielectric layer. A second two adjacent capacitors of the plurality may include first plates formed in a third contiguous portion of the first metal layer or second plates formed in a fourth contiguous portion of the second metal layer, the third contiguous portion different from the first contiguous portion and the fourth contiguous portion different from the second contiguous portion. Three adjacent capacitors in the plurality may include the first two adjacent capacitors and the second two adjacent capacitors. The circuit may further include a first bonding terminal; and a second bonding terminal separated from the first terminal by a first distance; wherein the plurality of capacitors may be distributed to substantially span the first distance. The first and second bonding terminals may be configured for flip-chip mounting. The first and second bonding terminals may be formed as solder balls, copper pillars, or gold studs.

In another embodiment, there is provided, a radio frequency (RF) circuit including a plurality of capacitors formed on a substrate, the plurality including: a first capacitor having a first terminal formed in first portion of a first metal layer and a second terminal formed in a first portion of a second metal layer; a second capacitor having a first terminal formed in a second portion of the first metal layer and a second terminal formed in the first portion of the second metal layer, the second portion of the first metal layer separate from the first portion of the first metal layer; and a third capacitor having a first terminal formed in the second portion of first metal layer and a second terminal formed in a second portion of the second metal layer, the second portion of the second metal layer separate from the first portion of the second metal layer. The plurality may include an even number of capacitors connected in series. Each capacitor of the plurality may include a dielectric layer disposed between the first and second terminals. Each capacitor of the plurality may be formed from overlapping portions of the first metal layer, the second metal layer, and the dielectric layer. Each capacitor of the plurality is characterized as a metal-insulator-metal (MIM) capacitor having the dielectric layer formed from a nitride material. The circuit may further include a first bonding terminal connected to the first portion of the first metal layer; and a second bonding terminal separated from the first terminal by a first distance; wherein the plurality of capacitors is distributed to substantially span the first distance. The first and second bonding terminals may be configured for flip-chip mounting. The first and second bonding terminals may be formed as solder balls, copper pillars, or gold studs.

In yet another embodiment, there is provided, a radio frequency (RF) circuit including a plurality of capacitors connected in series between a first bonding terminal and a second bonding terminal, the plurality including: a first capacitor having a first plate formed in first portion of a first metal layer and a second plate formed in a first portion of a second metal layer; a second capacitor having a first plate formed in a second portion of first metal layer and a second plate formed in the first portion of the second metal layer, the second portion of the first metal layer separate from the first portion of the first metal layer; and a third capacitor having a first plate formed in the second portion of first metal layer and a second plate formed in a second portion of the second metal layer, the second portion of the second metal layer separate from the first portion of the second metal layer; and a power amplifier having an output coupled to the first bonding terminal of the plurality. The power amplifier output may be coupled to the first bonding terminal of the plurality by way of a transmission line. Each capacitor of the plurality may be characterized as a metal-insulator-metal (MIM) capacitor having a dielectric insulator disposed between the first plate and the second plate, the dielectric insulator formed from a nitride material.

By now it should be appreciated that there has been provided, a thin-film, metal-insulator-metal (MIM) chip capacitor structure including a plurality of series connected MIM capacitors arranged to span a distance between bonding terminals. The capacitors are symmetrically arranged and connected to one another in an alternating manner having top or bottom plates of adjacent capacitors sharing a portion of a metal layer. The symmetrical arrangement is formed without using interconnect structures such as vias and contacts. The bonding terminals are configured for flip-chip mounting to eliminate bond wires in a chip capacitor package.

Because the capacitors are formed in a series, each capacitor can be physically larger thus minimizing parasitic effects. Forming the series symmetrically without vias and contacts allows further minimization of parasitic effects. Flip-chip mounting provides yet further minimization of parasitic effects. By minimizing and virtually eliminating many of these parasitic effects, accuracy, efficiency, and performance of radio frequency (RF) circuits can be enhanced.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A radio frequency (RF) circuit comprising:
a plurality of capacitors connected in series, each capacitor of the plurality including:
a first plate formed from a first metal layer; and
a second plate formed from a second metal layer;
wherein a first capacitor and a second capacitor of the plurality include first plates formed in a first contiguous portion of the first metal layer and the second capacitor and a third capacitor of the plurality include second plates formed in a second contiguous portion of the second metal layer.

2. The circuit of claim 1, wherein the plurality includes an even number of capacitors connected in series.

3. The circuit of claim 1, wherein each capacitor of the plurality includes a dielectric layer disposed between the first plate and the second plate.

4. The circuit of claim 3, wherein each capacitor of the plurality is formed from overlapping portions of the first metal layer, the second metal layer, and the dielectric layer.

5. The circuit of claim 1, wherein the third capacitor and a fourth capacitor of the plurality include first plates formed in a third contiguous portion of the first metal layer, the third contiguous portion separate from the first contiguous portion.

6. The circuit of claim 5, wherein the first, second, third, and fourth capacitors in the plurality are interconnected without contacts or vias.

7. The circuit of claim 1 further comprising:
a first bonding terminal; and
a second bonding terminal separated from the first terminal by a first distance;
wherein the plurality of capacitors is distributed to substantially span the first distance.

8. The circuit of claim 7, wherein the first and second bonding terminals are configured for flip-chip mounting.

9. The circuit of claim 7, wherein the first and second bonding terminals are formed as solder balls, copper pillars, or gold studs.

10. A radio frequency (RF) circuit comprising:
a plurality of capacitors formed on a substrate, the plurality including:
a first capacitor having a first plate formed in first portion of a first metal layer and a second plate formed in a first portion of a second metal layer;
a second capacitor having a first plate formed in a second portion of the first metal layer and a second plate formed in the first portion of the second metal layer, the second portion of the first metal layer separate from the first portion of the first metal layer; and
a third capacitor having a first plate formed in the second portion of first metal layer and a second plate formed in a second portion of the second metal layer, the second portion of the second metal layer separate from the first portion of the second metal layer.

11. The circuit of claim 10, wherein the plurality includes an even number of capacitors connected in series.

12. The circuit of claim 10, wherein each capacitor of the plurality includes a dielectric layer disposed between the first and second plates.

13. The circuit of claim 12, wherein each capacitor of the plurality is formed from overlapping portions of the first metal layer, the second metal layer, and the dielectric layer.

14. The circuit of claim 12, wherein each capacitor of the plurality is characterized as a metal-insulator-metal (MIM) capacitor having the dielectric layer formed from a nitride material.

15. The circuit of claim 10 further comprising:
a first bonding terminal connected to the first portion of the first metal layer; and
a second bonding terminal separated from the first bonding terminal by a first distance;
wherein the plurality of capacitors is distributed to substantially span the first distance.

16. The circuit of claim 15, wherein the first and second bonding terminals are configured for flip-chip mounting.

17. The circuit of claim 15, wherein the first and second bonding terminals are formed as solder balls, copper pillars, or gold studs.

18. A radio frequency (RF) circuit comprising:
a plurality of capacitors connected in series between a first bonding terminal and a second bonding terminal, the plurality including:
a first capacitor having a first plate formed in first portion of a first metal layer and a second plate formed in a first portion of a second metal layer;
a second capacitor having a first plate formed in a second portion of first metal layer and a second plate formed in the first portion of the second metal layer, the second portion of the first metal layer separate from the first portion of the first metal layer; and
a third capacitor having a first plate formed in the second portion of first metal layer and a second plate formed in a second portion of the second metal layer, the second portion of the second metal layer separate from the first portion of the second metal layer; and
a power amplifier having an output coupled to the first bonding terminal of the plurality.

19. The circuit of claim 18, wherein the power amplifier output is coupled to the first bonding terminal of the plurality by way of a transmission line.

20. The circuit of claim 18, wherein each capacitor of the plurality is characterized as a metal-insulator-metal (MIM) capacitor having a dielectric insulator disposed between the first plate and the second plate, the dielectric insulator formed from a nitride material.

* * * * *